(12) United States Patent
Guerrero

(10) Patent No.: US 7,108,958 B2
(45) Date of Patent: Sep. 19, 2006

(54) PHOTOSENSITIVE BOTTOM ANTI-REFLECTIVE COATINGS

(75) Inventor: Douglas J. Guerrero, Rolla, MO (US)

(73) Assignee: Brewer Science Inc., Rolla, MO (US)

( * ) Notice: Subject to any disclaimer, the term of this patent is extended or adjusted under 35 U.S.C. 154(b) by 0 days.

(21) Appl. No.: 10/627,792

(22) Filed: Jul. 25, 2003

(65) Prior Publication Data

US 2004/0219456 A1 Nov. 4, 2004

Related U.S. Application Data

(60) Provisional application No. 60/400,461, filed on Jul. 31, 2002.

(51) Int. Cl.
*G03F 7/004* (2006.01)

(52) U.S. Cl. ............... 430/270.1; 430/271.1; 430/325; 430/326; 430/330; 526/92; 428/412; 428/423.1

(58) Field of Classification Search ............. 430/270.1, 430/271.1, 325, 326, 330; 525/92; 428/412, 428/423.1
See application file for complete search history.

(56) References Cited

U.S. PATENT DOCUMENTS

| | | | | |
|---|---|---|---|---|
| 3,615,615 | A | * | 10/1971 | Lincoln et al. ............ 430/614 |
| 3,856,751 | A | * | 12/1974 | Wilson ..................... 528/293 |
| 4,175,175 | A |   | 11/1979 | Johnson et al. |
| 4,320,224 | A |   | 3/1982  | Rose et al. |
| 4,996,247 | A |   | 2/1991  | Nelson et al. |
| 5,554,473 | A | * | 9/1996  | Cais et al. ............... 430/58.4 |
| 5,691,101 | A |   | 11/1997 | Ushirogouchi et al. |
| 5,739,254 | A |   | 4/1998  | Fuller et al. |
| 6,054,254 | A |   | 4/2000  | Sato et al. |
| 6,071,662 | A | * | 6/2000  | Carmichael et al. .......... 430/69 |
| 6,110,653 | A |   | 8/2000  | Holmes et al. |
| 6,319,649 | B1 |  | 11/2001 | Kato et al. |
| 6,319,651 | B1 |  | 11/2001 | Holmes et al. |
| 6,338,936 | B1 |  | 1/2002  | Ichikawa et al. |
| 6,359,028 | B1 |  | 3/2002  | Miya et al. |
| 6,576,409 | B1 |  | 8/2002  | Ichikawa et al. |
| 6,451,498 | B1 |  | 9/2002  | Pirri et al. |
| 6,586,560 | B1 |  | 7/2003  | Chen et al. |
| 6,740,469 | B1 |  | 5/2004  | Krishnamurthy et al. |
| 6,838,223 | B1 |  | 1/2005  | Yoon et al. |
| 6,844,131 | B1 |  | 1/2005  | Oberlander et al. |
| 2002/0009599 | A1 | | 1/2002 | Welch et al. |
| 2003/0129531 | A1 | | 7/2003 | Oberlander et al. |
| 2003/0129547 | A1 | | 7/2003 | Neisser et al. |
| 2003/0166828 | A1 | | 9/2003 | Cox et al. |
| 2003/0215736 | A1 | | 11/2003 | Oberlander et al. |
| 2004/0018451 | A1 | | 1/2004 | Choi |
| 2004/0058275 | A1 | | 3/2004 | Neef et al. |
| 2004/0077173 | A1 | | 4/2004 | Sivakumar |

FOREIGN PATENT DOCUMENTS

WO WO 2004/113417 A1 12/2004

OTHER PUBLICATIONS

Synthesis and Characterizations of Photodefinable Polycarbonates for use as Sacrificial Materials in the Fabrication of Microfludic Devices, White et al., S.P.I.E. Proc., vol. 4690, p. 242 (2002).
Removable Organic Antireflective Coating, Sturtevant et al., S.P.I.E., vol. 2724 pp. 738-746 (1996).
Compatibility of Chemically Amplified Photoresist with Bottome Anti-Reflective Coatings, Yoshino, et al., S.P.I.E., vol. 3333, pp. 655-665 (1998).

\* cited by examiner

*Primary Examiner*—Amanda Walke
(74) *Attorney, Agent, or Firm*—Hovey Williams LLP

(57) ABSTRACT

Anti-reflective compositions and methods of using these compositions to form circuits are provided. The compositions comprise a polymer dissolved or dispersed in a solvent system. Preferred polymers include polycarbonates, polysulfonyl esters, polycarbonate sulfones, and mixtures thereof. The compositions can be applied to a silicon wafer or other substrate to form a cured or hardened layer which is initially insoluble in typical photoresist developing solutions. Upon exposure to light, the cured or hardened layers become soluble in photoresist developing solutions so that the layer can be selectively removed along with the developed photoresist layer, thus eliminating the need for a separate removal step.

59 Claims, No Drawings

PHOTOSENSITIVE BOTTOM ANTI-REFLECTIVE COATINGS

RELATED APPLICATIONS

This application claims the priority benefit of a provisional application entitled PHOTOSENSITIVE BOTTOM ANTI-REFLECTIVE COATINGS, Ser. No. 60/400,461, filed Jul. 31, 2002, incorporated by reference herein.

BACKGROUND OF THE INVENTION

1. Field of Invention

The present invention is concerned with new anti-reflective compositions for use in photolithographic and semiconductor integrated circuit manufacturing. In particular, the compositions are used as bottom anti-reflective coatings which become soluble in typical photoresist developing solutions upon exposure to light.

2. Background of the Prior Art

The most common steps for removing bottom anti-reflective coatings from a substrate are wet and dry development processes. In the wet process, the bottom anti-reflective coating is exposed to an alkaline media which causes the polymer to dissolve. Most wet developable bottom anti-reflective coatings are based on polyamic acid-imide chemistry. That is, the conversion of an acid (alkaline soluble) to an imide (alkaline insoluble) is the basis for controlling the ability to remove the film. This chemical change is thermally induced, and there is a bake window in which the bottom anti-reflective coating is insoluble in the resist solvent but soluble in alkaline media. The main challenge with this process is maintaining and controlling the bake window to avoid scum (polymer residue) and to keep the bottom anti-reflective coating from being removed by the resist.

In the dry development process, a high energy plasma—typically oxygen—removes the bottom anti-reflective coating. This process works well, but it requires an additional processing step which increases the cost of manufacturing and throughput.

There is a need for improved bottom anti-reflective coatings which solve the problem of having to control a bake window and which eliminate the extra step required by dry development processes.

SUMMARY OF THE INVENTION

The present invention overcomes these problems by broadly providing novel polymers and bottom anti-reflective coatings which include those polymers.

In more detail, the inventive polymers are selected from the group consisting of polycarbonates, polysulfonyl esters, and polycarbonate-sulfones (i.e., polymers which include recurring monomers having both an —$SO_2$ group and a —$CO_3$ group).

In embodiments where the polymer is a polycarbonate, preferred polycarbonates comprise recurring monomers having the formula

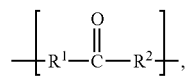

(I)

where each of $R^1$ and $R^2$ is individually selected from the group consisting of functional moieties of diols, including aliphatic (preferably $C_1$–$C_{12}$) diols, aromatic (preferably $C_4$–$C_{12}$) diols, and heterocyclic diols). Preferred diols include those selected from the group consisting of bisphenols.

In a preferred embodiment, at least one of $R^1$ and $R^2$ is selected from the group consisting of functional moieties of the bisphenols (and preferably bisphenol P and/or bisphenol Z). In this embodiment, it is preferred that the other of $R^1$ and $R^2$ has the formula

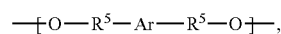

where $R^5$ is an alkyl group (substituted or unsubstituted, preferably $C_1$–$C_{12}$, and more preferably $C_1$–$C_6$), and Ar is an aryl group (substituted or unsubstituted, preferably at least $C_4$, more preferably $C_4$–$C_{12}$, and even more preferably $C_6$–$C_{10}$).

In another embodiment, when one of $R^1$ or $R^2$ is a moiety of bisphenol A, the other of $R^1$ and $R^2$ is a group other than

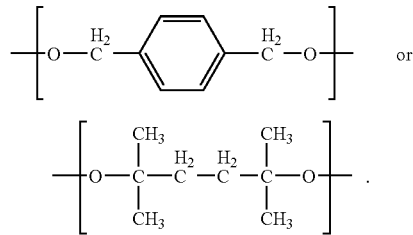

Particularly preferred $R^1$ and $R^2$ groups include those having a structure selected from the group consisting of

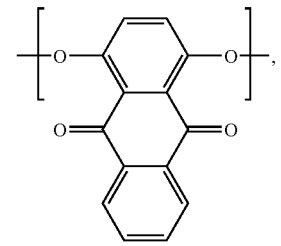

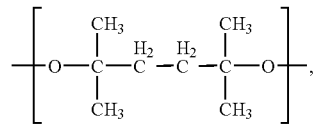

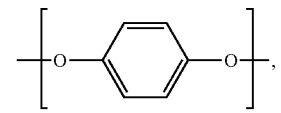

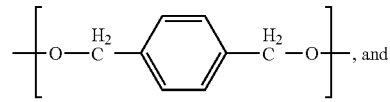

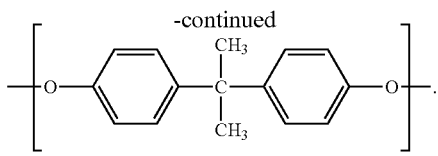

As used herein, the term "functional moiety" is intended to refer to moieties of compounds whose respective structures have been altered so that they may bond with other compounds. For example, the structure

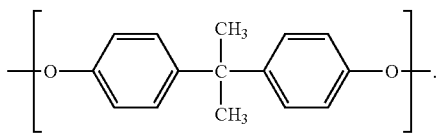

would be considered a functional moiety of bisphenol A, with the hydrogen atoms from each of the —OH groups originally present in the compound having been removed so that the oxygen atoms can bond with another compound or moiety.

In embodiments where the polymer is a polysulfonyl ester, the polymer preferably has the formula

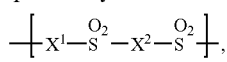   (II)

where $X^1$ is selected from the group consisting of functional moieties of diols and dioximes. Preferred diols include aliphatic (preferably $C_1$–$C_{12}$) diols, aromatic (preferably $C_4$–$C_{12}$) diols, and heterocyclic diols. Particularly preferred diols include those selected from the group consisting of the bisphenols. Preferred dioximes include aliphatic (preferably $C_1$–$C_{12}$) dioximes, aromatic (preferably $C_4$–$C_{12}$) dioximes, and heterocyclic dioximes. Particularly preferred dioximes include those derived from the condensation of an aliphatic diamine ($NH_2$-carbon chain-$NH_2$) and substituted or unsubstituted hydroxybenzaldehydes and hydroxyacetyl benzenes. One particularly preferred example is 1,4-diacetyl benzene dioxime.

In a preferred embodiment, $X^1$ has the formula —O-Z-O— where Z is selected from the group consisting of substituted and unsubstituted aryls (preferably at least $C_4$, more preferably $C_4$–$C_{12}$, and even more preferably $C_6$–$C_{10}$), substituted and unsubstituted alkyls (preferably $C_1$–$C_{12}$, and more preferably $C_1$–$C_6$), and combinations thereof. Particularly preferred $X^1$ groups have a structure selected from the group consisting of

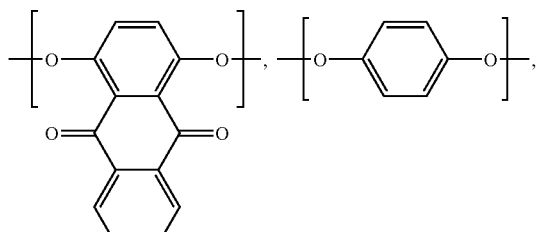

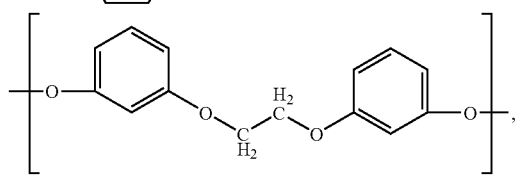

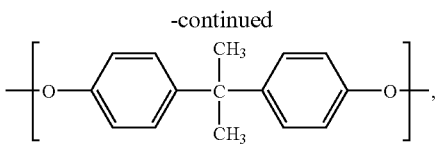

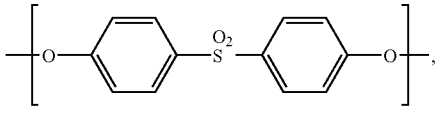

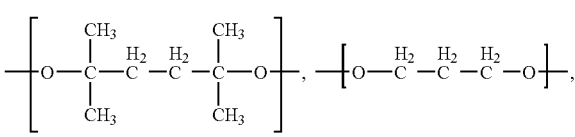

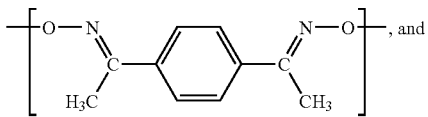

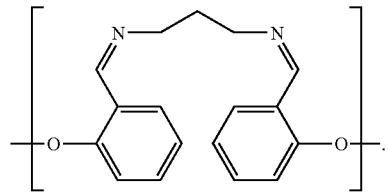

In formula (II), $X^2$ is selected from the group consisting of substituted and unsubstituted aryls (preferably at least $C_4$, more preferably $C_4$–$C_{12}$, and even more preferably $C_6$–$C_{10}$) and substituted and unsubstituted alkyls (preferably $C_1$–$C_{12}$, and more preferably $C_1$–$C_6$). Particularly preferred $X^2$ groups include those selected from the group consisting of phenyls, naphthyls, furyls, thionyls, and anthranyls. It is preferred that at least one of $X^1$ and $X^2$ includes an aromatic portion or other light absorbing group.

In embodiments where the polymer is a polycarbonate sulfone, a preferred structure for this polymer is

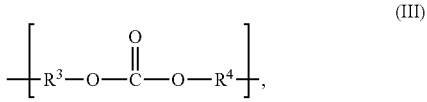   (III)

where each of $R^3$ and $R^4$ is individually selected from the group consisting of substituted and unsubstituted aryls (preferably at least $C_4$, more preferably $C_4$–$C_{12}$, and even more preferably $C_6$–$C_{10}$), and alkyls (preferably $C_1$–$C_{12}$, and more preferably $C_1$–$C_6$).

At least one of $R^3$ and $R^4$ will include an —$SO_2$ group, and it is preferred that at least one of $R^3$ and $R^4$ includes an aromatic portion or other light absorbing group. Particularly preferred $R^3$ and $R^4$ groups include those selected from the group consisting of

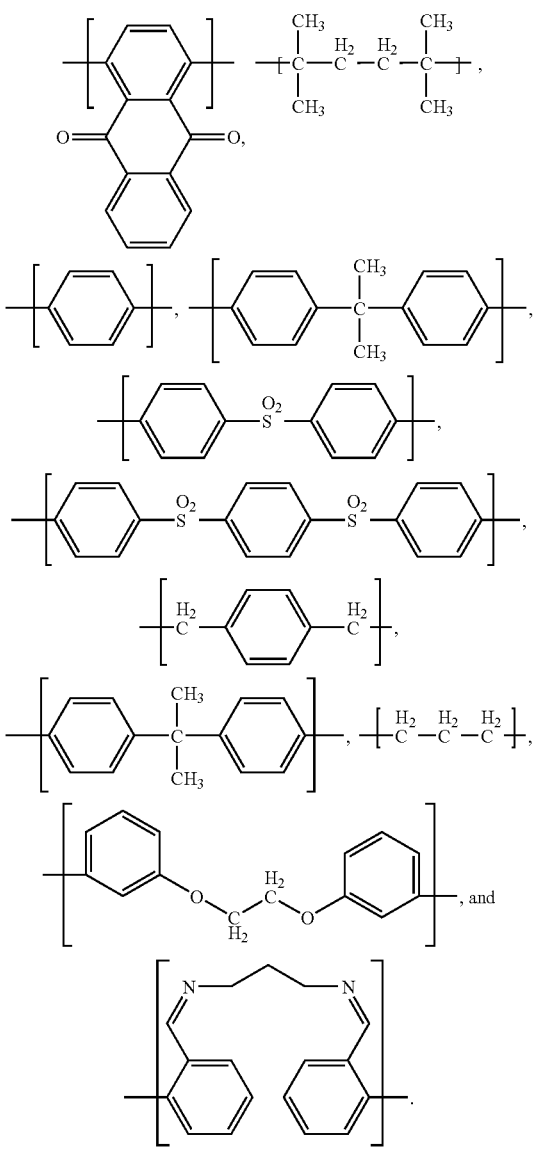

Preferably, the polymer has an average molecular weight of from about 1,000–100,000 Daltons, more preferably from about 2,000–50,000 Daltons, and even more preferably from about 2,000–20,000 Daltons.

These polymers can be utilized to make compositions (e.g., anti-reflective coatings) for use in microlithographic processes. The compositions are formed by simply dispersing or dissolving the polymer(s) in a suitable solvent system, preferably at ambient conditions and for a sufficient amount of time to form a substantially homogeneous dispersion. Preferred compositions comprise from about 1–20% by weight polymer, and preferably from about 2–10% by weight polymer, based upon the total weight of the composition taken as 100% by weight.

The solvent systems can include any solvent suitable for use in the microelectronic manufacturing environment. Preferred solvent systems include a solvent selected from the group consisting of propylene glycol monomethyl ether (PGME), propylene glycol monomethyl ether acetate (PGMEA), ethyl lactate, propylene glycol, n-propyl ether (PnP), cyclohexanone, γ-butyrolactone, and mixtures thereof. The solvent should be present in the composition at a level of from about 80–98% by weight, based upon the total weight of the composition taken as 100% by weight. Preferably, the solvent system has a boiling point of from about 100–160° C.

Any additional ingredients are also preferably dispersed in the solvent system along with the polymer. Examples of suitable additional ingredients include crosslinking agents, catalysts (e.g., photoacid generators or "PAGs"), and surfactants. Preferred crosslinking agents include aminoplasts (e.g., POWDERLINK® 1174, Cymel® products), multifunctional epoxy resins (e.g., MY720, CY179MA, DENACOL), anhydrides, and mixtures thereof. When used, the crosslinking agent is present in the composition at a level of from about 10–50% by weight, and preferably from about 15–30 by weight, based upon the total weight of the solids in the composition taken as 100% by weight.

Suitable PAGs include both ionic and nonionic PAGs. Examples of particularly preferred PAGs include sulfonic acid-type PAGs such as those sold under the names CGI 261, CGI 1397, and CGI 1311 (CIBA Specialty Chemicals). When used, the PAG should be present in the composition at a level of from about 0.05–10% by weight, and preferably from about 2–8% by weight, based upon the total weight of the solids in the composition taken as 100% by weight.

The method of applying the inventive anti-reflective compositions to a substrate (e.g., silicon, aluminum, tungsten, tungsten silicide, gallium arsenide, germanium, tantalum, SiGe, and tantalum nitride wafers) simply comprises applying a quantity of a composition hereof to the substrate surface (either a planar surface or one comprising vias or holes formed therein) by any conventional application method, including spin-coating. The layer should then be heated to at least about the crosslinking or curing temperature of the composition (e.g., about 80–180° C.) so as to cure or harden the layer which can be formulated to have a thickness of anywhere from about 300–2,000 Å (less than the thickness of the photoresist layer), where the thickness is defined as the average of 5 measurements taken by an ellipsometer.

The refractive index (n value) of the cured anti-reflective layer or coating will be at least about 1.4, and preferably from about 1.4–1.7 at a wavelength of about 193 nm. Furthermore, the OD of the cured layer will be at least about 2/μm, and preferably at least about 5/μm at a wavelength of about 193 nm. Stated another way, the cured anti-reflective layer will absorb at least about 80%, preferably at least about 90%, and more preferably at least about 95%, of light at a wavelength of about 193 nm when the layer is about 400 Å thick.

It will be appreciated that, at this stage in the process, the cured layers are substantially insoluble in solvents (e.g., ethyl lactate, propylene glycol monomethyl ether acetate) typically used in conjunction with photoresists. Furthermore, the cured layers are substantially insoluble in typical photoresist developers (e.g., alkaline developers such as tetramethylammonium hydroxide (TMAH)). In either instance, the thickness of the layer will change by less than about 10%, preferably less than about 5%, and more preferably by about 0% after contact with the photoresist solvent or the developer. As used herein, the percent change is defined as:

$$100 \cdot \frac{|(\text{thickness prior to solvent contact}) - (\text{thickness after solvent contact})|}{(\text{thickness prior to solvent contact})}$$

A photoresist can be applied to the cured material, followed by exposing thereof to light or activating radiation having the desired wavelength (e.g., wavelengths of from about 150–500 nm). Upon exposure to light, the cured anti-reflective layer will undergo a chemical change, thus causing the layer to be soluble in typical photoresist developers. That is, the cured compositions can, at this stage, be substantially (and preferably completely) removed with conventional aqueous developers such as TMAH and alkaline metal developers. Some of these developers are commercialized under the tradenames MF-319 (available from Shipley, Mass.), MF-320 (available from Shipley), and NMD3 (available from TOK, Japan) developers. At least about 90%, and preferably at least about 99% of the inventive coatings will be removed by a base developer such as tetramethyl ammonium hydroxide and KOH developers. This percent solubility in commercially-available developers is a significant advantage over the prior art as this shortens the manufacturing process and makes it less costly.

DETAILED DESCRIPTION OF THE PREFERRED EMBODIMENTS

EXAMPLES

The following examples set forth preferred methods in accordance with the invention. It is to be understood, however, that these examples are provided by way of illustration and nothing therein should be taken as a limitation upon the overall scope of the invention. Unless stated otherwise, all materials in these examples were purchased from Aldrich Chemical Company and used as received.

Example 1

Synthesis of Polysulfonyl Ester

As one example, polysulfonyl esters according to the invention can be prepared by condensation of an aromatic diol and benzene disulfonyl chloride. In this procedure, a 100 ml, round-bottomed flask, sulfonyl diphenol (bisphenol S, 1.82 g), 1,3-benzenedisulfonyl chloride (2.0 g), and dichloromethane (40 ml) were mixed and stirred at room temperature. Pyridine (1.2 ml) was added at once, and the mixture was heated to reflux for 24 hours. The reaction was allowed to cool to room temperature, the solvent was concentrated to about 10 ml, and the polymer was precipitated into methanol (200 ml). A 2.73 g (83%) quantity of a white polymer was collected. FT-IR and elemental analysis were consistent with the proposed structure. The molecular weight obtained was 2,747. The structure of the resulting polymer is shown in Structure A.

Structure A

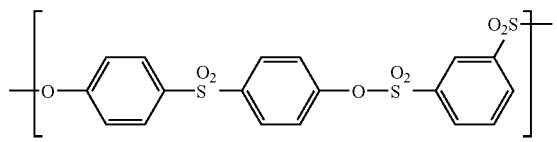

Example 2

Formulation of Coating

The polymer prepared in Example 1 was dissolved in 10 ml of a cyclohexanone (4%) solution. The resulting solution was spin-coated (1500 rpm) onto a silicon wafer and bake dried at 175° C. for 60 seconds. The baked film was immersed in a 0.25 N solution of TMAH but it could not be removed from the wafer by the TMAH. The film was subsequently exposed to a DUV source, and it was then soluble in a 0.25 N solution of TMAH. This indicates that the film underwent a chemical change upon exposure to DUV light. That is, upon exposure to light, the photoreactive linkage broke down and produced a sulfonic acid (—SO$_3$H—) which caused the polymer to become alkaline soluble. A generic reaction scheme showing the chemical change is depicted in Scheme 1.

The optical properties of the film were determined, and the film showed high absorbance at 193 nm (OD 21.4/μm) and moderate absorbance at 248 nm (OD 5.6/μm). This formulation could also be modified by adding a melamine or glycouril crossliker (about 25–50% by weight).

Scheme 1

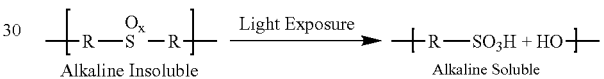

where:
R = light absorbing chromophore
X = 2 or 3

Example 3

Synthesis of Polycarbonate

Polymers according to the invention can be prepared, for example, by reacting a bisphenol monomer with a diol containing a nitrophenol leaving group, with the condensation polymerization process being carried out in refluxing chloroform. White et al., Synthesis and Characterization of Photodefinable Polycarbonates for Use as Sacrificial Materials in the Fabrication of Microfluidic Devices, *Proc. SPIE*, 4690, 242–253 (2002); Martin et al., A Convenient Laboratory Preparation of Aromatic Polycarbonates, *Polymer Bulletin*, 47, 517–520 (2002), each incorporated by reference herein.

In this procedure, the synthesis of polycarbonates was carried out in two steps. First, the monomer was prepared by adding (over a one-hour time period) a solution of 2.0 g of 4-nitrophenylchloroformate in 10 ml dry dichloromethane to a solution of 0.68 g 1,4-benzene dimethanol in 0.8 ml of dry pyridine and 30 ml of dry dichloromethane. The reaction mixture was refluxed overnight followed by cooling to room temperature. Sufficient CH$_2$Cl$_2$ was added to dissolve the suspension formed, and the solution was washed once with 100 ml distilled water, once with 5% HCl solution, and once more with distilled water. The organic layer was dried over magnesium sulfate after which it was filtered, and the solvent was removed by a rotary evaporator. The white solid product was recrystallized using dichloromethane and petroleum ether (10:1), thus yielding the desired monomer.

This monomer (2.0 g) was mixed with bisphenol A (0.97 g), potassium carbonate (2.72 g), a catalyst (18-crown-6, 0.13 g), and chloroform (75 ml) in a 250 ml, round-bottomed flask. The mixture was heated to reflux for 50 hours. The reaction mixture was allowed to cool to room temperature, the inorganic salts were filtered off, the filtrate was concentrated to about 20 ml, and the polymer was precipitated into methanol (200 ml). A white polymer (1.58 g, 89%) was collected. FT-IR and elemental analysis were consistent with proposed structure. The molecular weight obtained was 5,641. The structure of the resulting polymer is shown in Structure B.

In other procedures, other bisphenols were used, and higher molecular weights were obtained.

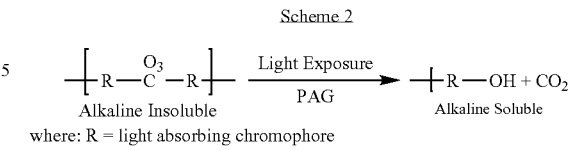

Scheme 2 where: R = light absorbing chromophore

Example 5

Synthesis of Polycarbonate Sulfone

One method by which these polymers can be prepared is similar to that described in Example 3.

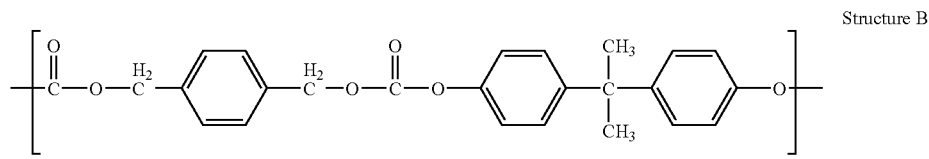

Structure B

Example 4

Formulation of Coating

The polymer (0.2 g) prepared in Example 3 was mixed with 0.04 g of CGI 1311 (a PAG, obtained from CIBA Specialty Chemicals) in 14 ml of PGMEA. The resulting solution was spin-coated (1500 rpm) onto a silicon wafer and bake dried at 100° C. for 60 seconds. The baked film was immersed in a 0.25 N solution of TMAH but it could not be removed from the wafer by the TMAH. The film was subsequently exposed to a DUV source, and it was then soluble in a 0.25 N solution of TMAH. This indicates that the film underwent a chemical change upon exposure to DUV light. That is, the carbonate linkage reacted with an acid (produced by the PAG upon exposure to light in this instance), thus decomposing and forming $CO_2$ and an alcohol. The composition became alkaline soluble. A generic reaction scheme showing the chemical change is depicted in Scheme 2.

The optical properties of the film were determined, and the film showed high absorbance at 193 nm (OD 24/μm).

In this procedure, the same monomer (4.68 g) prepared in Example 3 was reacted with bisphenol S (2.51 g), triethyl amine (2.79 ml), and dimethylamino pyridine (DMAP, 0.14 g) in acetonitrile (50 ml). The mixture was heated to reflux for 18 hours and then allowed to cool at room temperature. The solution was concentrated to about 15 ml and precipitated into methanol (125 ml). After drying overnight in a vacuum oven, 2.67 g (61%) of a yellow solid was collected. FT-IR and elemental analyses were consistent with the proposed structure. The structure of the resulting polymer is shown in Structure C.

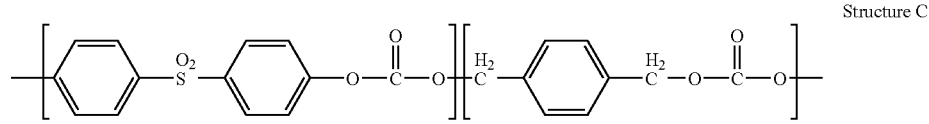

Structure C

Example 6

Formulation of Coating

The polymer prepared in Example 5 (0.4 g) was dissolved in 10 ml of a cyclohexanone (4%) solution. The resulting solution was spin-coated (1500 rpm) onto a silicon wafer followed by bake drying at 175° C. for 60 seconds. The baked film was immersed in a 0.25 N solution of TMAH but it could not be removed from the wafer by the TMAH. The film was subsequently exposed to a DUV source, and it was then soluble in a 0.25 N solution of TMAH. This indicates that the film underwent a chemical change upon exposure to DUV light. That is, upon exposure to light, the photoreactive linkage broke down and produced a sulfonic acid (—$SO_3H$—) which caused the carbonate linkage to decompose and become alkaline soluble. A generic reaction scheme showing the chemical change is depicted in Scheme 3.

The optical properties of the film were determined, and the film showed high absorbance at 193 nm (OD 20.6/μm).

Scheme 3

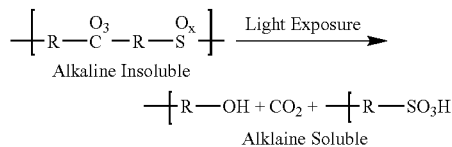

where:
R = light absorbing chromophore
X = 2 or 3

Example 7

Synthesis of Polysulfonylester

In a 250 ml, round-bottomed flask, benzenedimethanol (2.82 g) in 25 ml of tetrahydrofuran (THF) was treated with a 1M solution of potassium t-butoxide (41 ml) and stirred at room temperature for 10 min. A THF solution of 1,3-benzenedisulfonyl chloride (5.62 g in 25 ml of THF) was then added in portions to the reaction flask. The mixture was heated to reflux for 24 hours. The inorganic salts were then filtered, and the THF was removed under vacuum. The remaining residue was re-dissolved in chloroform (12 ml) and precipitated into methanol (150 ml). The precipitate was filtered and dried in a vacuum oven overnight. A white solid (0.90 g) was collected. The structure of the resulting polymer is shown in Structure D.

Structure D

Example 8

Synthesis of Polysulfonylester Oxime

In a 200 ml, round-bottomed flask, diacetylbenzene oxime (5.66 g) and triethyl amine (6.00 g) in chloroform (50 ml) were stirred at room temperature. Next, 1,3-benzenedisulfonyl chloride (8.08 g) was added in portions to the reaction flask. After stirring at room temperature for 30 minutes, the mixture was heated to reflux for 24 hours. The polymer precipitated out of the reaction mixture, and it was collected by filtration. After drying in a vacuum oven, 6.0 g of a brown polymer was collected. The structure of the resulting polymer is shown in Structure E.

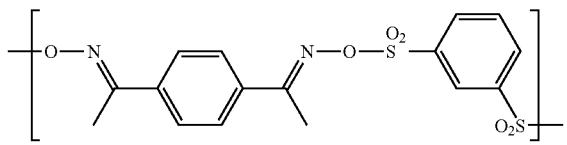

Structure E

Example 9

Synthesis of Polysulfonylester Imine

In this example, all materials were purchased from TCI and used as received. In a 250 ml, 2-neck, round-bottomed flask, N,N-disalicylal-1,2-propanediamine (3.00 g), 1,3-benzenedisulfonyl chloride (2.92 g), and chloroform (40 ml) were mixed and stirred at room temperature. Triethyl amine (2.95 ml) was added in portions, and the mixture was heated to reflux for 23 hours. The reaction mixture was allowed to cool to room temperature, the solvent was concentrated to about 15 ml, and the polymer was precipitated into methanol (250 ml). The polymer was collected, redissolved in chloroform (15 ml), and precipitated one more time into methanol (200 ml). After drying in a vacuum oven, 3.71 g (72%) of a yellow polymer was collected. The structure of the resulting polymer is shown in Structure F.

Structure F

Example 10

Formulation of Coating

The polymer prepared in Example 9 was dissolved in 10 ml of a 4% solution of ethyl lactate. The resulting solution was spin-coated (1,500 rpm) onto a silicon wafer and then bake dried at 150° C. The baked film was immersed in a 0.25 N solution of TMAH but it could not be removed from the wafer by the TMAH. The film was subsequently exposed to a DUV source, and it was then soluble in a 0.25 N solution of TMAH. This indicates that the film underwent a chemical change upon exposure to DUV light and, therefore, is photosensitive.

The optical properties of the film were determined, and the film showed high absorbance at 193 nm (OD 14.4/μm) and moderate absorbance at 248 nm (OD 5.53/μm), thus making it suitable for anti-reflective applications.

The above formulation can also be modified by adding a melamine or glycouril crosslinker (about 5–50% by weight) and a photoacid generator (about 1–10% by weight).

What is claimed is:

1. A polymer comprising recurring monomers having a formula selected from the group consisting of:

(I)

where:
each of $R^1$ and $R^2$ is individually selected from the group consisting of functional moieties of aliphatic diols, heterocyclic diols, bisphenol A, bisphenol P,

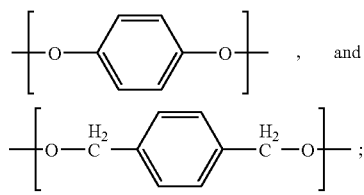
, and at least one of $R^1$ and $R^2$ is selected from the group consisting of functional moieties of the bisphenol A and bisphenol P; and
when one of $R^1$ or $R^2$ is a moiety of bisphenol A, the other of $R^1$ and $R^2$ is a group other than

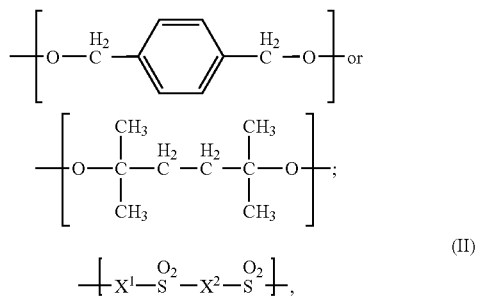

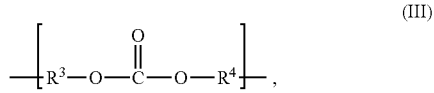
(II)

where:
$X^1$ is selected from the group consisting of functional moieties of diols and dioximes;
$X^2$ is selected from the group consisting of substituted and unsubstituted aryls and alkyls;
at least one of $X^1$ and $X^2$ includes an aromatic group; and (III)

where:
each of $R^3$ and $R^4$ is individually selected from the group consisting of substituted and unsubstituted aryls and alkyls;
at least one of $R^3$ and $R^4$ includes an —$SO_2$ group; and
at least one of $R^3$ and $R^4$ includes an aromatic group.

2. The polymer of claim 1, wherein:
said recurring monomers have the formula (I); and
one of $R^1$ and $R^2$ is selected from the group consisting of functional moieties of bisphenol P.

3. The polymer of claim 2, wherein the other of $R^1$ and $R^2$ has the formula

where $R^5$ is —$CH_2$— and Ar is an aryl group

4. The polymer of claim 1, wherein said recurring monomers have the formula (I) and one of $R^1$ and $R^2$ is selected from the group consisting of

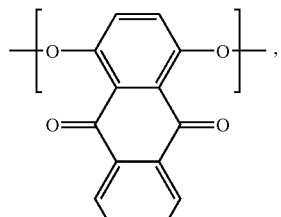
,

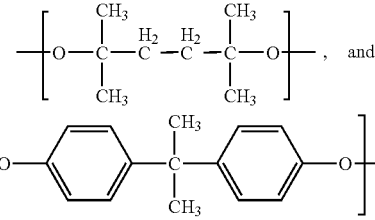
, and

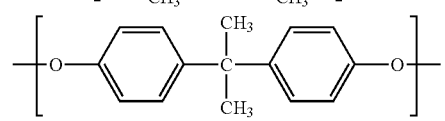
.

5. The polymer of claim 1, wherein said recurring monomers have the formula (II) and $X^2$ is a phenyl group.

6. The polymer of claim 1, wherein:
said recurring monomers have the formula (II);
$X^1$ has the formula —O-Z-O—; and
Z is selected from the group consisting of substituted and unsubstituted aryls, alkyls, and combinations thereof.

7. The polymer of claim 6, wherein $X^1$ has a formula selected from the group consisting of

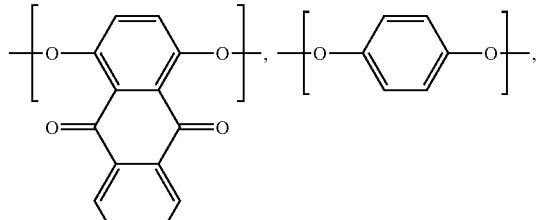

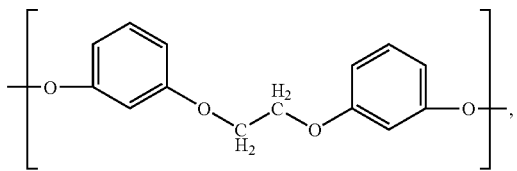

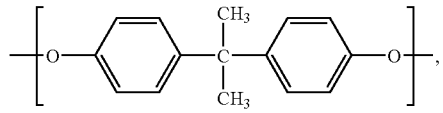

-continued

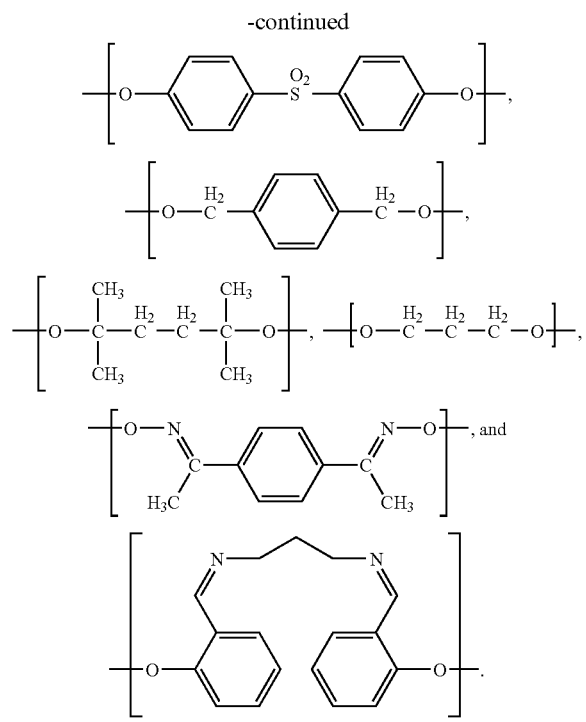

8. The polymer of claim 1, wherein:
said recurring monomers have the formula (III); and
at least one of $R^3$ and $R^4$ is selected from the group consisting of

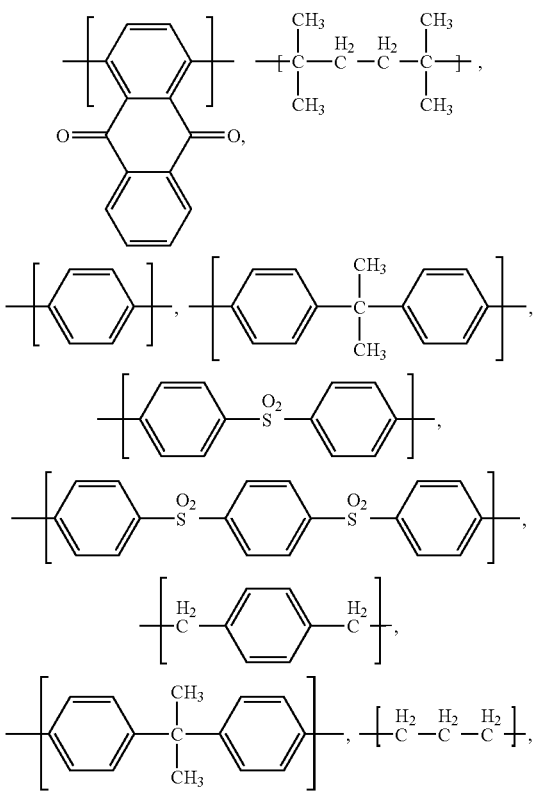

-continued

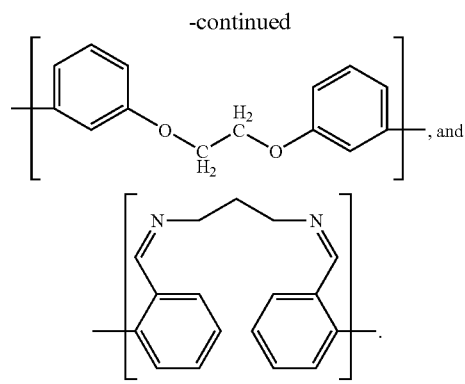

9. An anti-reflective composition comprising a polymer dispersed or dissolved in a solvent system, the improvement being that said polymer is selected from the group consisting of polysulfonyl esters, polycarbonate sulfones, polycarbonates comprising recurring monomers having a formula selected from the group consisting of:

$$\left[ R^1 - \overset{O}{\underset{\|}{C}} - R^2 \right] \quad (I)$$

where:
each of $R^1$ and $R^2$ is individually selected from the group consisting of functional moieties of diols;
at least one of $R^1$ and $R^2$ is selected from the group consisting of functional moieties of the bisphenols; and
when one of $R^1$ or $R^2$ is a moiety of bisphenol A, the other of $R^1$ and $R^2$ is a group other than

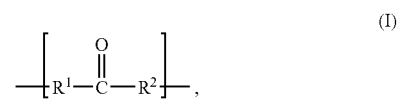 or

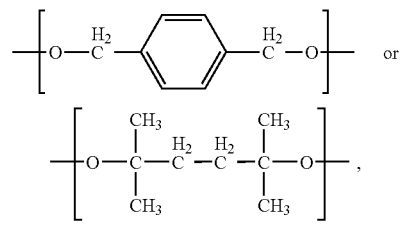

and mixtures of the foregoing.

10. The composition of claim 9, wherein said composition can be cured or hardened to form an anti-reflective layer which absorbs at least about 80% of light at a wavelength of about 193 nm and at a layer thickness of about 400 Å.

11. The composition of claim 9, wherein said polymer has an average molecular weight of from about 2,000–20,000 Daltons.

12. The composition of claim 9, said polymer comprising recurring monomers having a formula selected from the group consisting of:

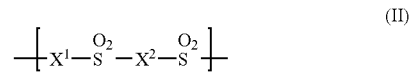 (II)

where:
X¹ is selected from the group consisting of functional moieties of diols and dioximes;
X² is selected from the group consisting of substituted and unsubstituted aryls and alkyls;
at least one of X¹ and X² includes an aromatic group; and

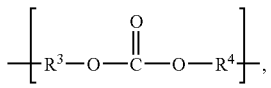

where:
each of R³ and R⁴ is individually selected from the group consisting of substituted and unsubstituted aryls and alkyls;
at least one of R³ and R⁴ includes an —SO₂ group; and
at least one of R³ and R⁴ includes an aromatic group.

13. The composition of claim 9, wherein said recurring monomers have the formula (I) and at least one of R¹ and R² is selected from the group consisting of functional moieties of the bisphenols.

14. The composition of claim 13, wherein one of R¹ and R² is selected from the group consisting of functional moieties of bisphenol P and bisphenol Z.

15. The composition of claim 14, wherein the other of R¹ and R² has the formula

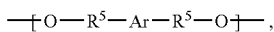

where R⁵ is an alkyl group and Ar is an aryl group.

16. The composition of claim 9, wherein said recurring monomers have the formula (I) and one of R¹ and R² is selected from the group consisting of

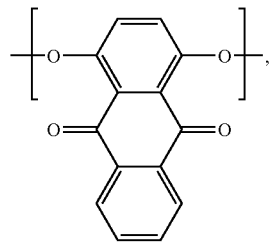

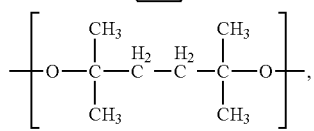

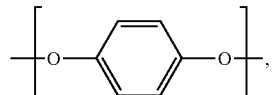

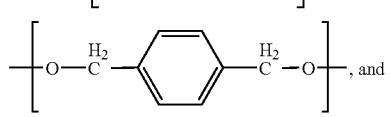

-continued

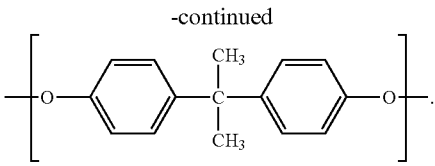

17. The composition of claim 12, wherein said recurring monomers have the formula (II) and X² is a phenyl group.

18. The composition of claim 12, wherein:
said recurring monomers have the formula (II);
X¹ has the formula —O-Z-O—; and
Z is selected from the group consisting of aryls, alkyls, and combinations thereof.

19. The composition of claim 18, wherein X¹ has a formula selected from the group consisting of

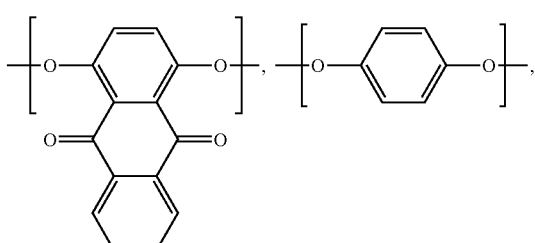

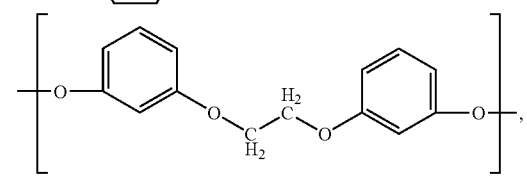

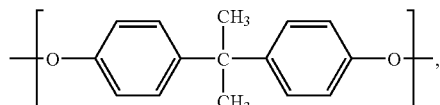

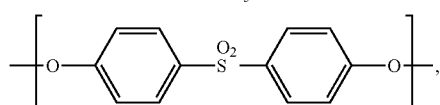

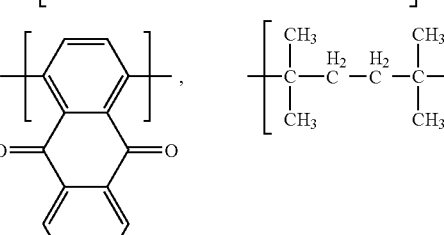

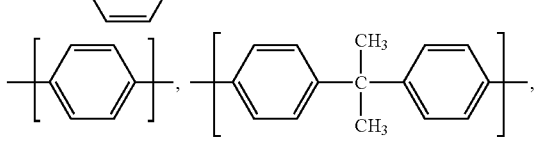

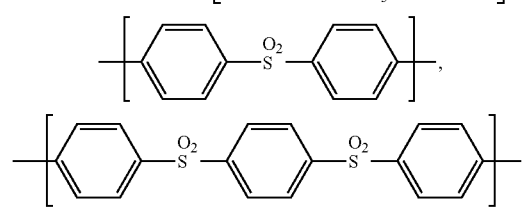

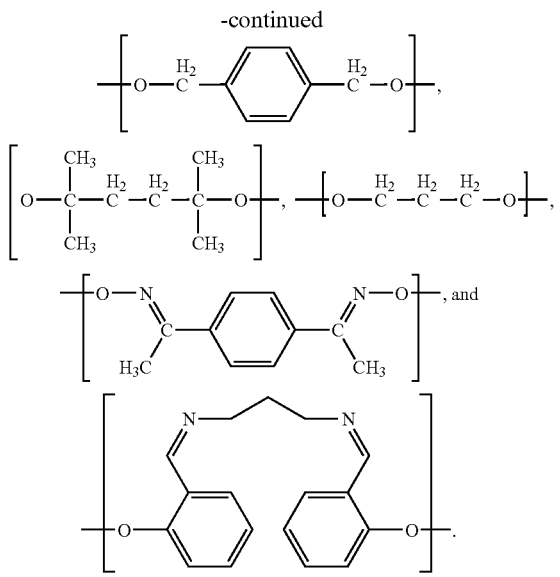

20. The composition of claim 12, wherein:
said recurring monomers have the formula (III); and
at least one of $R^3$ and $R^4$ is selected from the group consisting of

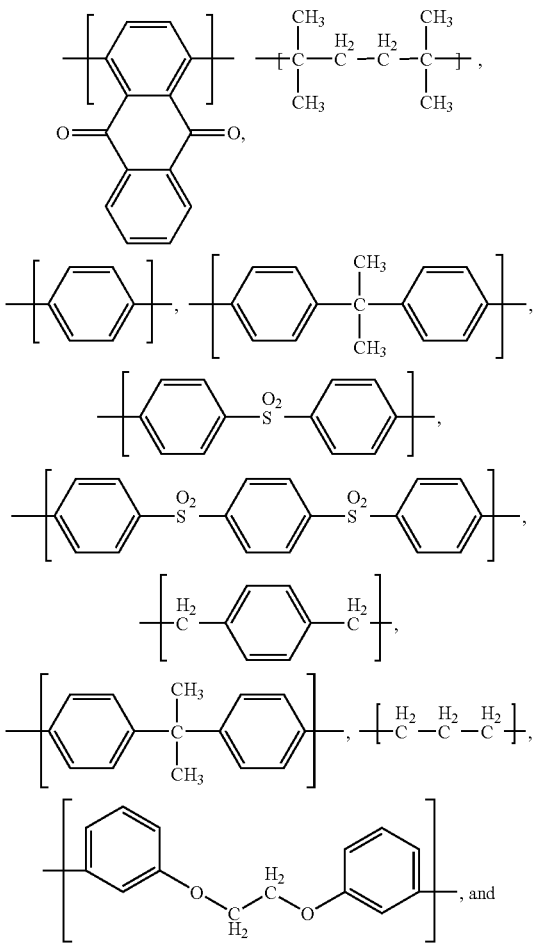

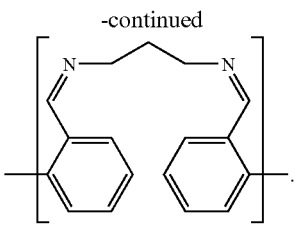

21. A method of using a composition in photolithographic processes, said method comprising the step of applying a quantity of a composition to a substrate to form a layer thereon, said composition comprising:
  a solvent system; and
  a polymer dispersed or dissolved in said solvent system, wherein said polymer is selected from the group consisting of polysulfonyl esters, polycarbonate sulfones, polycarbonates comprising recurring monomers having a formula selected from the group consisting of:

$$\left[ R^1 - \overset{O}{\underset{\|}{C}} - R^2 \right], \quad (I)$$

where:
  each of $R^1$ and $R^2$ is individually selected from the group consisting of functional moieties of diols;
  at least one of $R^1$ and $R^2$ is selected from the group consisting of functional moieties of the bisphenols; and
  when one of $R^1$ or $R^2$ is a moiety of bisphenol A, the other of $R^1$ and $R^2$ is a group other than and mixtures of the foregoing.

22. The method of claim 21, wherein said applying step comprises spin-coating said composition onto said substrate surface.

23. The method of claim 21, wherein said substrate has a hole formed therein, said hole being defined by a bottom wall and sidewalls, and said applying step comprises applying said composition to at least a portion of said bottom wall and sidewalls.

24. The method of claim 21, further including the step of baking said layer at a temperature of from about 80–180° C. to yield a cured or hardened layer.

25. The method of claim 24, wherein after said baking step, said cured or hardened layer is substantially insoluble in a photoresist developer.

26. The method of claim 24, further including the step of applying a photoresist to said cured or hardened layer.

27. The method of claim 26, furthering including the steps of:
exposing at least a portion of said photoresist to light; and developing said exposed photoresist.

28. The method of claim 27, wherein said developing step results in the removal of said cured or hardened layer from areas adjacent said exposed photoresist.

29. The method of claim 28, wherein said developing step comprises contacting said photoresist and said cured or hardened layer with an alkaline developer.

30. The method of claim 24, further including the step of exposing at least a portion of said cured or hardened layer to light, wherein after said exposing step, said cured or hardened layer is substantially soluble in a photoresist developer.

31. The method of claim 24, wherein said composition to forms an anti-reflective layer which absorbs at least about 80% of light at a wavelength of about 193 nm and at a layer thickness of about 400 Å.

32. The method of claim 21, said polymer comprising recurring monomers having a formula selected from the group consisting of:

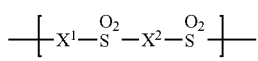

where:
X$^1$ is selected from the group consisting of functional moieties of diols and dioximes;
X$^2$ is selected from the group consisting of substituted and unsubstituted aryls and alkyls;
at least one of X$^1$ and X$^2$ includes an aromatic group; and

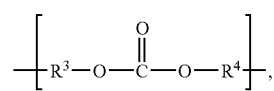

where:
each of R$^3$ and R$^4$ is individually selected from the group consisting of substituted and unsubstituted aryls and alkyls;
at least one of R$^3$ and R$^4$ includes an —SO$_2$ group; and
at least one of R$^3$ and R$^4$ includes an aromatic group.

33. The method of claim 21, wherein said recurring monomers have the formula (I) and at least one of R$^1$ and R$^2$ is selected from the group consisting of functional moieties of the bisphenols.

34. The method of claim 21, wherein said recurring monomers have the formula (I) and one of R$^1$ and R$^2$ is selected from the group consisting of

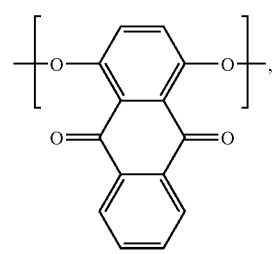

-continued

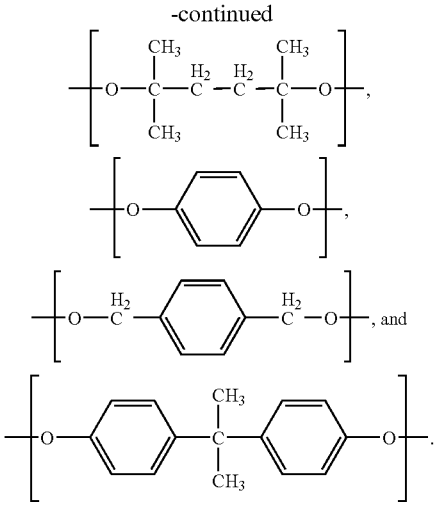

35. The method of claim 32, wherein said recurring monomers have the formula (II) and X$^2$ is a phenyl group.

36. The method of claim 32, wherein:
said recurring monomers have the formula (II);
X$^1$ has the formula —O-Z-O—; and
Z is selected from the group consisting of aryls, alkyls, and combinations thereof.

37. The method of claim 32, wherein:
said recurring monomers have the formula (III); and
at least one of R$^3$ and R$^4$ is selected from the group consisting of

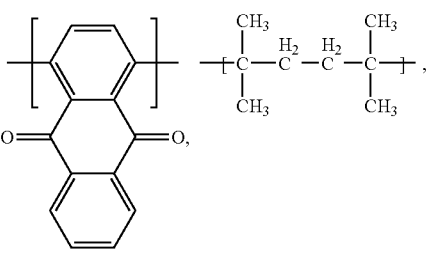

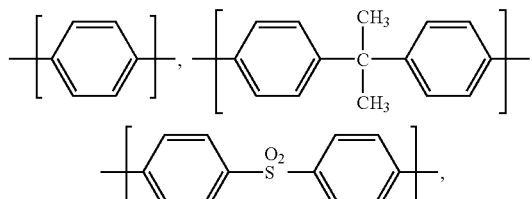

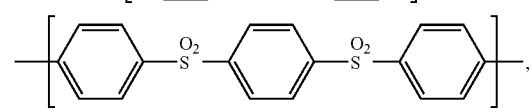

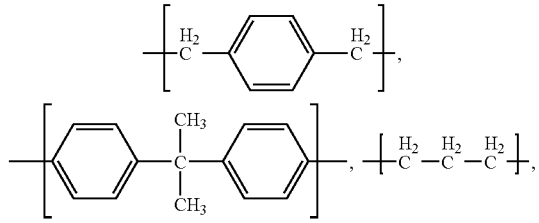

-continued

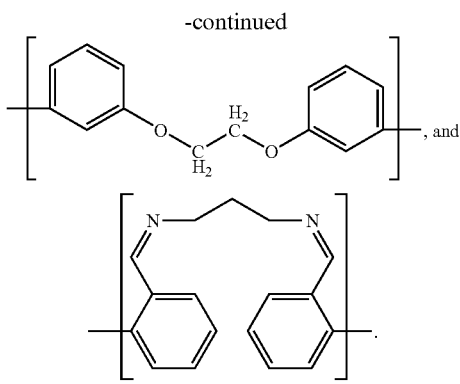

38. The method of claim 21, wherein said substrate is selected from the group consisting of silicon, aluminum, tungsten, tungsten suicide, gallium arsenide, germanium, tantalum, SiGe, and tantalum nitride wafers.

39. A precursor structure formed during photolithographic processes, said structure comprising:
a substrate having a surface;
an anti-reflective layer on said substrate surface, said layer being formed from a composition comprising:
a solvent system; and
a polymer dispersed or dissolved in said solvent system, wherein said polymer is selected from the group consisting of polysulfonyl esters, polycarbonate sulfones, polycarbonates comprising recurring monomers having a formula selected from the group consisting of:

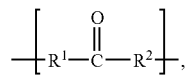

where:
each of $R^1$ and $R^2$ is individually selected from the group consisting of functional moieties of diols;
at least one of $R^1$ and $R^2$ is selected from the group consisting of functional moieties of the bisphenols; and
when one of $R^1$ or $R^2$ is a moiety of bisphenol A, the other of $R^1$ and $R^2$ is a group other than

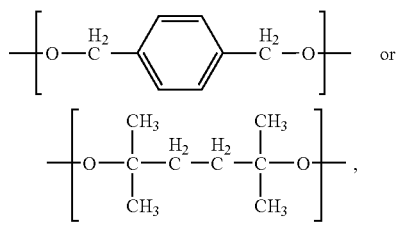

and mixtures of the foregoing.

40. The structure of claim 39, wherein said anti-reflective layer can be cured or hardened to form a layer which is substantially insoluble in a photoresist developer.

41. The structure of claim 39, further including a photoresist adjacent said anti-reflective layer.

42. The structure of claim 39, wherein said composition can be cured or hardened to form an anti-reflective layer which absorbs at least about 80% of light at a wavelength of about 193 nm and at a layer thickness of about 400 Å.

43. The structure of claim 39, said polymer comprising recurring monomers having a formula selected from the group consisting of:

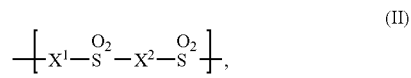

where:
$X^1$ is selected from the group consisting of functional moieties of diols and dioximes;
$X^2$ is selected from the group consisting of substituted and unsubstituted aryls and alkyls;
at least one of $X^1$ and $X^2$ includes an aromatic group; and

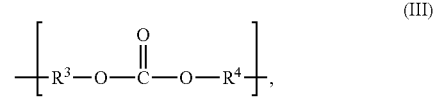

where:
each of $R^3$ and $R^4$ is individually selected from the group consisting of substituted and unsubstituted aryls and alkyls;
at least one of $R^3$ and $R^4$ includes an —$SO_2$ group; and
at least one of $R^3$ and $R^4$ includes an aromatic group.

44. The structure of claim 39, wherein said recurring monomers have the formula (I) and at least one of $R^1$ and $R^2$ is selected from the group consisting of functional moieties of the bisphenols.

45. The structure of claim 39, wherein said recurring monomers have the formula (I) and one of $R^1$ and $R^2$ is selected from the group consisting of

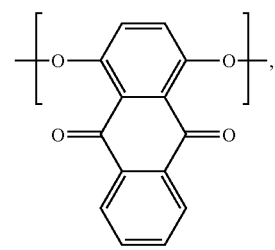

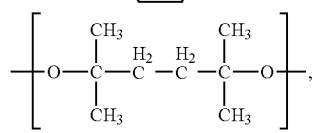

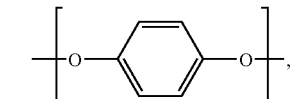

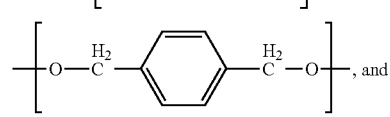

-continued

[chemical structure: —O—C6H4—C(CH3)2—C6H4—O—]

46. The structure of claim 43, wherein said recurring monomers have the formula (II) and $X^2$ is a phenyl group.

47. The structure of claim 43, wherein:
said recurring monomers have the formula (II);
$X^1$ has the formula —O-Z-O—; and
Z is selected from the group consisting of aryls, alkyls, and combinations thereof.

48. The structure of claim 43, wherein:
said recurring monomers have the formula (III); and
at least one of $R^3$ and $R^4$ is selected from the group consisting of

[chemical structures shown]

49. The structure of claim 43, wherein said substrate is selected from the group consisting of silicon, aluminum, tungsten, tungsten silicide, gallium arsenide, germanium, tantalum, SiGe, and tantalum nitride wafers.

50. A polymer comprising recurring monomers having the formula $$\left[R^1-\overset{O}{\underset{\|}{C}}-R^2\right],\quad (I)$$

where:
one of $R^1$ and $R^2$ is selected from the group consisting of functional moieties of bisphenol Z; and
the other of $R^1$ and $R^2$ has the formula $$-\!\!\left[O-R^5-Ar-R^5-O\right]\!\!-,$$

where $R^5$ is an alkyl group and Ar is an aryl group.

51. The polymer of claim 50, wherein $R^5$ is a $C_1$–$C_{12}$ alkyl group and Ar is a $C_4$–$C_{12}$ aryl group.

52. An anti-reflective composition comprising a polymer dispersed or dissolved in a solvent system, the improvement being that said polymer is selected from the group consisting of polycarbonates, polysulfonyl esters, polycarbonate sulfones, and mixtures thereof, said polymer having an average molecular weight of from about 2,000–20,000 Daltons.

53. A method of using a composition in photolithographic processes, said method comprising the step of applying a quantity of a composition to a substrate to form a layer thereon, said composition comprising:
a solvent system; and
a polymer dispersed or dissolved in said solvent system, wherein said polymer is selected from the group consisting of polycarbonates, polysulfonyl esters, polycarbonate sulfones, and mixtures thereof, said polymer having an average molecular weight of from about 2,000–20,000 Daltons.

54. The method of claim 53, further comprising the step of baking said layer to yield a cured or hardened layer.

55. The method of claim 54, further including the step of exposing at least a portion of said cured or hardened layer to light, wherein after said exposing step said cured or hardened layer is substantially soluble in a photoresist developer.

56. The method of claim 55, wherein prior to said exposing step, said cured or hardened layer is substantially insoluble in a photoresist developer.

57. The method of claim 53, wherein said substrate is selected from the group consisting of silicon, aluminum, tungsten, tungsten silicide, gallium arsenide, germanium, tantalum, SiGe, and tantalum nitride wafers.

58. A precursor structure formed during photolithographic processes, said structure comprising:
a substrate having a surface;
an anti-reflective layer on said substrate surface, said layer being formed from a composition comprising:
a solvent system; and
a polymer dispersed or dissolved in said solvent system, wherein said polymer is selected from the group consisting of polycarbonates, polysulfonyl esters, polycarbonate sulfones, and mixtures thereof, said polymer having an average molecular weight of from about 2,000–20,000 Daltons.

59. The method of claim 58, wherein said substrate is selected from the group consisting of silicon, aluminum, tungsten, tungsten suicide, gallium arsenide, germanium, tantalum, SiGe, and tantalum nitride wafers.

* * * * *